United States Patent
Reinhart et al.

(10) Patent No.: US 7,348,763 B1
(45) Date of Patent: Mar. 25, 2008

(54) METHOD FOR UTILIZING TEMPERATURE TO DETERMINE A BATTERY STATE

(75) Inventors: Ronald R. Reinhart, St. Petersburg, FL (US); Frederick M. Jenkins, St. Petersburg, FL (US); James M. Raver, St. Petersburg, FL (US); Thong L. Nguyen, Largo, FL (US); Martin A. Schaefer, Clearwater, FL (US)

(73) Assignee: Linvatec Corporation, Largo, FL (US)

( * ) Notice: Subject to any disclaimer, the term of this patent is extended or adjusted under 35 U.S.C. 154(b) by 449 days.

(21) Appl. No.: 10/745,458

(22) Filed: Dec. 22, 2003

Related U.S. Application Data (60) Provisional application No. 60/435,888, filed on Dec. 20, 2002, provisional application No. 60/435,937, filed on Dec. 20, 2002, provisional application No. 60/435,965, filed on Dec. 20, 2002.

(51) Int. Cl.
 *H01M 10/44* (2006.01)
(52) U.S. Cl. .................................... 320/150
(58) Field of Classification Search ............... 320/128, 320/130, 131, 132, 150; 324/427, 430, 433
See application file for complete search history.

(56) References Cited

U.S. PATENT DOCUMENTS

| 4,234,840 | A | 11/1980 | Konrad et al. |
| 4,320,334 | A | 3/1982 | Davis et al. |
| 4,775,827 | A | 10/1988 | Ijntema et al. |
| 5,438,270 | A | 8/1995 | Harper et al. |
| 5,694,023 | A | 12/1997 | Podrazhansky et al. |
| 5,698,983 | A | 12/1997 | Arai et al. |
| 5,717,312 | A | 2/1998 | Maeda et al. |
| 6,011,379 | A | 1/2000 | Singh et al. |
| 6,157,171 | A | 12/2000 | Smith |
| 6,232,748 | B1* | 5/2001 | Kinoshita ................ 320/132 |
| 2003/0016023 | A1* | 1/2003 | Richter et al. ............. 324/427 |

* cited by examiner

*Primary Examiner*—Edward H Tso
(74) *Attorney, Agent, or Firm*—Howrey LLP (57) ABSTRACT

A method for determining the state of a battery, or battery pack, that is independent of the type of battery technology under test. The method employs one or more charging and discharging cycles, and measures one or more parameters of battery voltage, temperature, charging time, and charging cycle counts to produce a test value that is compared to empirical data. Based on the comparison, the state is determined, for example, on a pass/fail basis. The method may be embodied as instructions stored in memory and implemented by means of a microprocessor coupled to the memory. In another embodiment, the empirical data is stored within another memory located internal to the battery pack under test.

10 Claims, 10 Drawing Sheets

METHOD FOR UTILIZING TEMPERATURE TO DETERMINE A BATTERY STATE

This application claims the benefit of U.S. Provisional Application No. 60/435,888 filed Dec. 20, 2002, U.S. Provisional Application No. 60/435,937 filed Dec. 20, 2002, and U.S. Provisional Application No. 60/435,965 filed Dec. 20, 2002, each of which is hereby incorporated by reference herein as though set forth in full.

This application is related to U.S. patent application Ser. No. 10/745,337, entitled "Microprocessor Controlled Battery Charger," filed concurrently herewith, and U.S. patent application Ser. No. 10/745,338, entitled "Microprocessor Based Surgical Handpiece," filed concurrently herewith, each of which is incorporated by reference herein as though set forth in full.

BACKGROUND OF THE INVENTION

1. Field of the Invention

The present invention is a method for determining the state of a battery or batteries that form a battery pack. This invention has general applications in battery charging or battery evaluation systems. More specifically, this invention has applications in battery charger control systems that utilize digital signal processor (DSP) technology for reconditioning battery packs used to power appliances such as motorized medical devices.

2. Related Art

Batteries come in many different forms and many different sizes. Regardless of battery form or application, battery quality tends to diminish over time. Quite often, batteries will remain idle for long periods of time before a demand for battery power arises. Certain applications require a highly reliable source of battery power, for example, emergency lighting systems, uninterruptible power supplies (UPS), and applications in portable appliances used during time-sensitive procedures. In these cases, a user may need to assess the quality, or state of health (SOH), of a battery under load in order to predict whether, and for how long, the battery may continue to provide reliable service.

A common method for evaluating a battery is by measuring voltage at the battery terminals while the battery is under load. However, measurements taken under load conditions are known to introduce uncertainty due resistive effects from test leads, contacts, and internal components of the battery. One attempt to overcome this problem is presented in U.S. Pat. No. 6,157,171, which describes an apparatus and method for monitoring battery voltage while disconnecting or powering down the battery load. This method measures an instantaneous no-load battery voltage, and, responsive to a comparison of the measurement to a reference value, generates an appropriate charge or discharge signal. One drawback, however, is that this method fails to account for many other factors that can affect battery voltage, such as temperature fluctuation and charge cycle history. As such, this method has a limited practical use as a control system for a battery charger. When applied to an aged battery that is unable to maintain a charge, the method may produce an oscillating output of charge and discharge signals, making it unsuitable for use in predicting a battery's SOH.

SUMMARY

The present invention provides a method for determining the state, or SOH, of a battery, or battery pack, that is independent of the type of battery technology under test. The method employs a combination of charging cycles, discharging cycles, no-load voltage measurements, optional temperature measurements, optional charging times, and/or optional charge cycle counts to produce a test value that is compared to empirical data for the type of battery under test. Based on the comparison, the SOH is determined, for example, on a pass/fail basis. In an exemplary embodiment, the method is embodied as instructions stored in a memory and implemented by means of a microprocessor coupled to the memory. In another embodiment, the empirical data is stored within another memory located internal to the battery pack under test.

In one embodiment, the method comprises steps of charging a battery, discharging the battery through a load at a substantial rate for a fixed period of time, measuring the battery voltage immediately after removing the load to obtain a test value, and comparing the test value to a threshold voltage that is based on empirical data. In another embodiment, the method includes measuring a temperature of the battery, compensating a measured test value according to the measured temperature, and comparing the compensated value to a set point.

In another embodiment, the method comprises charging a battery, and measuring battery voltages immediately before and after the end of the charging period. The battery then undergoes a discharge cycle, and another voltage measurement is taken immediately before the end of the discharge period. A temperature measurement is taken before the end of discharge. Differences are computed between the voltage measurements to obtain test values, and these values are compared to setpoints that are adjusted according to the measured temperature. The SOH is determined based on comparing the test values to empirical data.

Another aspect of the invention comprises steps for discharging a battery to achieve a desired level of unloaded voltage. This is accomplished by discharging the battery through a load, monitoring the voltage of the battery during discharge, and interrupting the discharge when the monitored voltage achieves the desired value. The unloaded voltage is then measured and compared to the desired value, and if the unloaded voltage exceeds the desired value, the load is reconnected to discharge the battery for an additional period of time. The previous step is continued until an unloaded voltage is measured that is equal to or less than the desired value.

One advantage of a method according to the invention is that it is independent of the type of battery under test. Another advantage is that the method is very effective in determining defective conditions within the battery. Certain values of measured voltage are indicative of open cell, shorted cell, and weak cell conditions.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures.

DETAILED DESCRIPTION

As utilized herein, terms such as "about" and "substantially" and "nearly" are intended to allow some leeway in mathematical exactness to account for tolerances that are acceptable in the trade. Accordingly, any deviations upward or downward from the value modified by the terms such as "about" or "substantially" or "nearly" in the range of 1% to 25% or less should be considered to be explicitly within the scope of the stated value. Also herein, the term "battery" refers both to a single battery and to multiple batteries electrically coupled within a single bank or battery pack.

Figure 1:
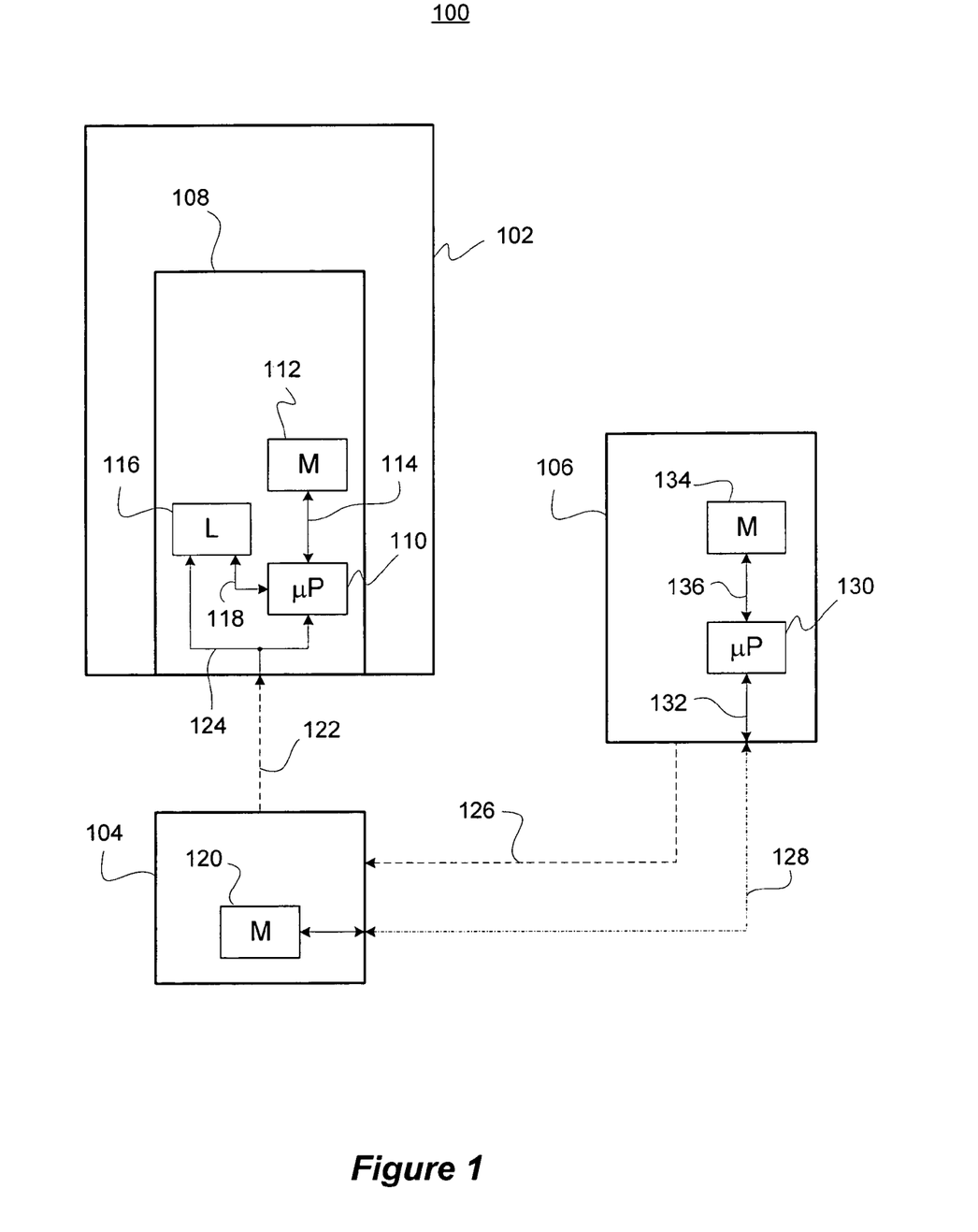
FIG. 1 is a block diagram of one exemplary system having an application for a method according to the invention.

In one or more embodiments, the present invention may be incorporated within a battery charging system, or within another system that uses as a power source one or more batteries charged by the battery charging system. FIG. 1 illustrates an exemplary system 100 comprising an appliance 102, a battery pack 104, and a battery charging system 106. Appliance 102 may be any device that operates on battery power, for example, a portable motorized appliance. In system 100, appliance 102 comprises a hand held motorized instrument having a hermetically or environmentally sealed portion 108 that houses electrical components that drive appliance 102. These may include, for example, a microprocessor 110 coupled to a memory 112 through a communication bus 114, and to load sensors of load 116 through communication bus 118. In one embodiment, load 116 comprises a motor, and load sensors (not shown) may comprise one or more sensors such as voltage, current, torque, temperature, and speed sensors. As used herein, the term microprocessor is used interchangeably with the term digital signal processor (DSP), and may denote any commercially available DSP such as a Motorola DSP56F803 microcontroller.

Battery pack 104 may consist of a single battery, or multiple batteries electrically coupled in some series or parallel configuration. Battery pack 104 is not limited to any particular battery technology, and may comprise, for example, any of the following battery types: alkaline, carbon, lead-acid, lithium ion, lithium-iron sulfide, lithium polymer, lithium-MNO2, nickel-cadmium, nickel-metal-hydride, nickel-zinc, and zinc-air. Battery pack 104 may optionally be configured with an internal memory 120 that stores data readable by battery charger 106. Memory 120 may be any type of solid state memory device, such as RAM, ROM, EPROM, flash memory, etc. In one embodiment, memory 120 comprises a Texas Instruments BQ2019 chip. Memory 120 may store, for example, data indicative of battery temperature, battery chemistry, capacity, voltage, charge cycles, charging current, rated charging time, and battery identification such as a serial number. Battery pack 104 may be removably coupled to appliance 102 by a coupling means 122 to provide DC power to microprocessor 110 and to load 116 through power bus 124.

Battery pack 104 may also be removably coupled to battery charger 106 by coupling means 126, which connects the power terminals (not shown) of battery pack 104 to the DC output of battery charger 106 during recharging operations. When battery pack 104 is coupled to battery charger 106, a communications link 128 is also established between memory 120 and battery charger microprocessor 130 through communications bus 132. Communications link 128 may be established by any conventional means such as a serial bus or a JTAG type interface. Microprocessor 130 is coupled to battery charger internal memory 134 through communications bus 136. Memory 134 contains the software programs required to control various battery charging operations.

Figure 2A:
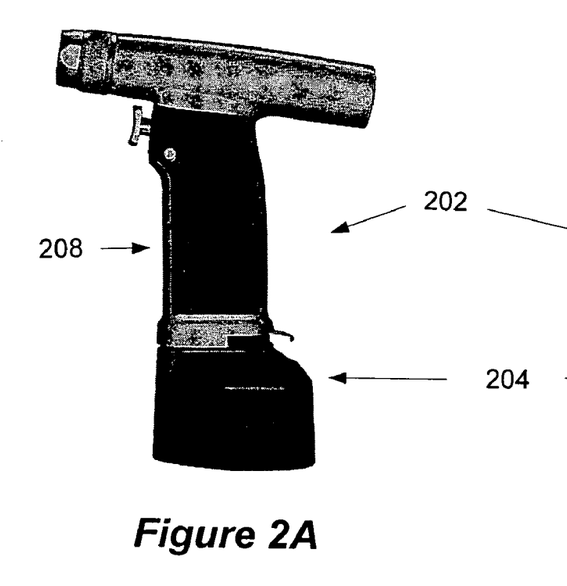
FIG. 2a is an illustration of a hand held appliance powered by a rechargeable battery having a state determined according to the invention.
Figure 2B:
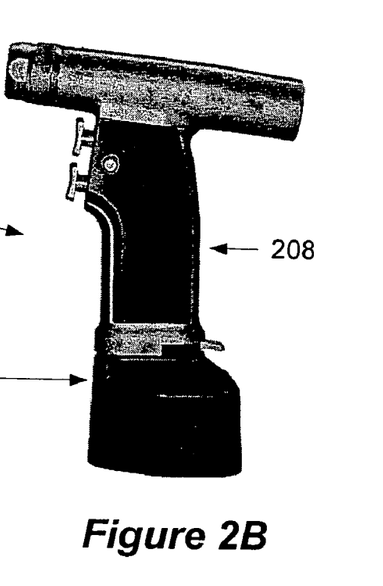
FIG. 2b is another illustration of a hand held appliance powered by a rechargeable battery having a state determined according to the invention.
Figure 2C:
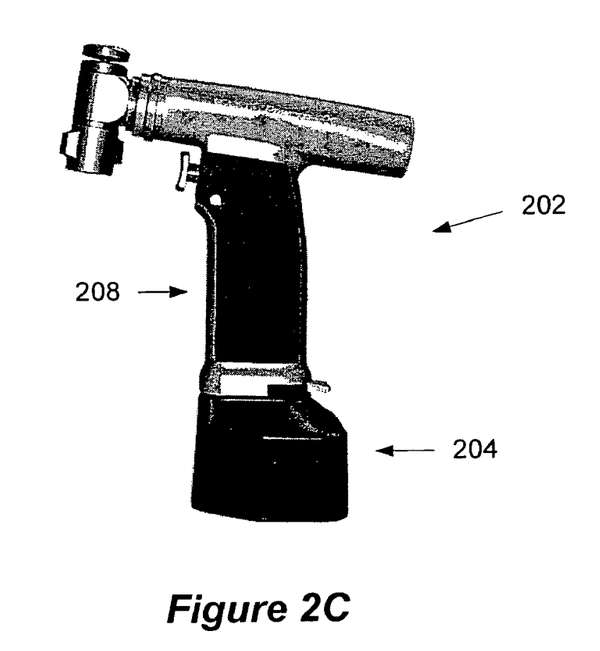
FIG. 2c is a third illustration of a hand held appliance powered by a rechargeable battery having a state determined according to the invention.

FIGS. 2a, 2b, and 2c illustrate different embodiments of a hand held appliance 202 coupled to a battery pack 204. Battery pack 204 is configured for reconditioning by means of a battery charger employing methods according to the invention. These embodiments of an appliance 202 comprise battery powered surgical handpieces used in the performance of time-sensitive medical procedures where highly reliable battery power is essential. In each of these figures, battery pack 204 and housing 208 comprise environmentally sealed casings suitable for sterilization by steam autoclave at a temperature up to 270 F for 10 minutes without loss of function. Rigorous sterilization procedures such as this consume resources that are not wisely expended on battery packs in an uncertain SOH.

Figures 3A, 3B:
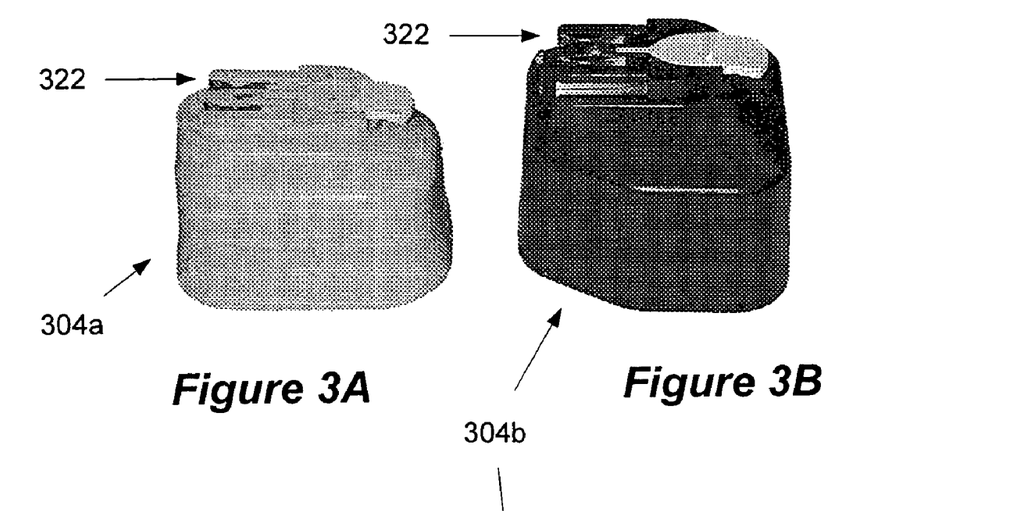
FIGS. 3a-3b illustrate different sizes of the battery shown in FIGS. 2a-2c.
Figure 3C:
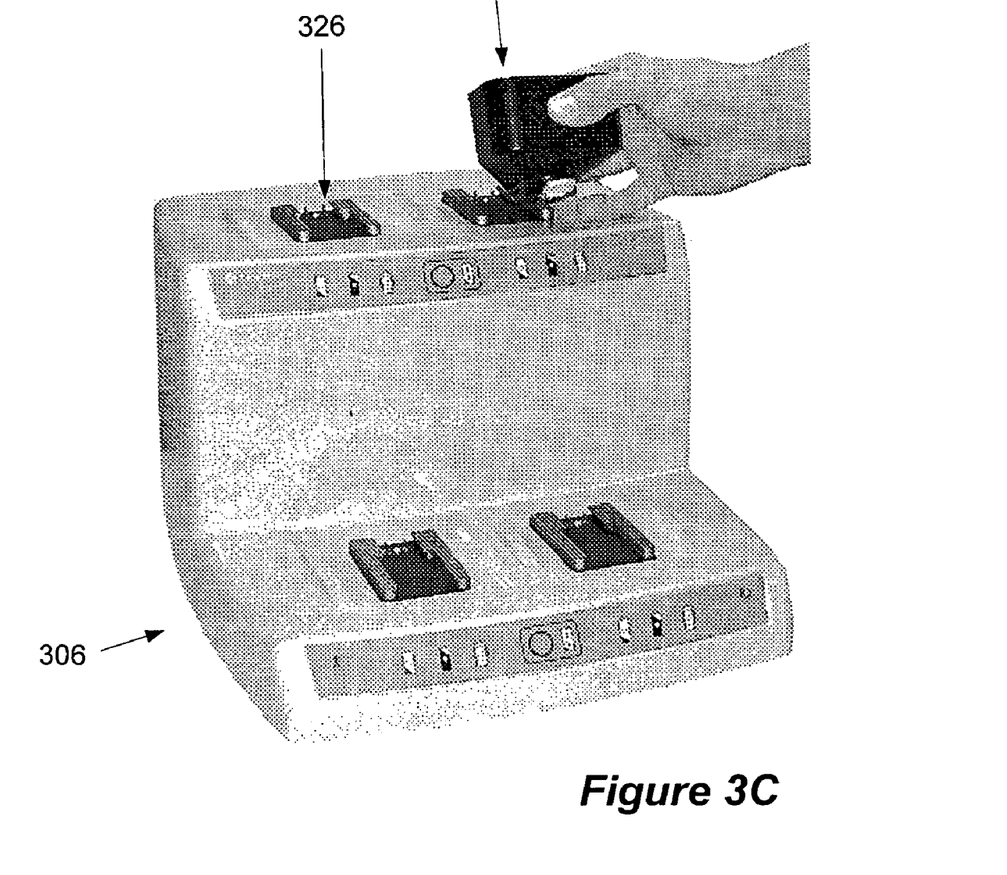
FIG. 3c illustrates one embodiment of a battery charger employing a method according to the invention.

FIGS. 3a and 3b illustrate different embodiments of a first battery pack 304a and a second battery pack 304b, each having a SOH determined according to the invention. Both battery packs 304a and 304b may be removably coupled to the same appliance 202 (as shown in FIGS. 2a-2c), or to a battery charger 306, as shown in FIG. 3c. Coupling a battery pack 304a or 304b to a battery charger 306 may be effected, for example, by manually locking a coupling means 326 located on charger 306 to a coupling means 322 located on either battery pack 304a or 304b. Coupling means 322 may be similar for both battery packs 304a and 304b, although a first battery pack 304a may comprise a different battery chemistry, or may have a different size or capacity rating than a battery pack 304b. Thus, a user may select form among different sizes and types of batteries to meet the demands of a particular application.

After completing a charging operation on a battery, it may be desirable to determine its SOH to assess reliability. An SOH is reliable if the battery can maintain a charge capacity sufficient to provide power for a desired application. By knowing the SOH, a user can determine whether a battery is suitable for use. In this respect, SOH may be expressed in different ways, for example, as a time period representing life expectancy, as a number of charging cycles remaining until end-of-life, or simply in terms of "pass" or "fail."

Throughout the following descriptions of methods according to the present invention, each functional step may represent an instruction implemented by a DSP coupled to one or more memories. For example, with reference again to FIG. 1, such an instruction may be implemented in system 100 by microprocessor 130 reading data stored in battery memory 120, and in response, running one or more programs stored in charger memory 134. Programs executed by the DSP may also control battery charger circuitry to perform fundamental battery charger functions such as charging and discharging a battery under test. The following methods may also depend on a DSP reading empirical data, or other battery-specific data, from a memory maintained within the battery pack under test, making these methods advantageously independent of battery type. Where a process step calls for measurement of a parameter such as battery voltage, temperature, charging current, or elapsed time, the measurement is understood to be achieved using appropriate instruments known in the art for sensing, transducing, and/or transmitting a signal representative of the measured parameter. In one embodiment, one or more signals representing measured parameters are digitized and input to a battery charger DSP.

Figure 4:
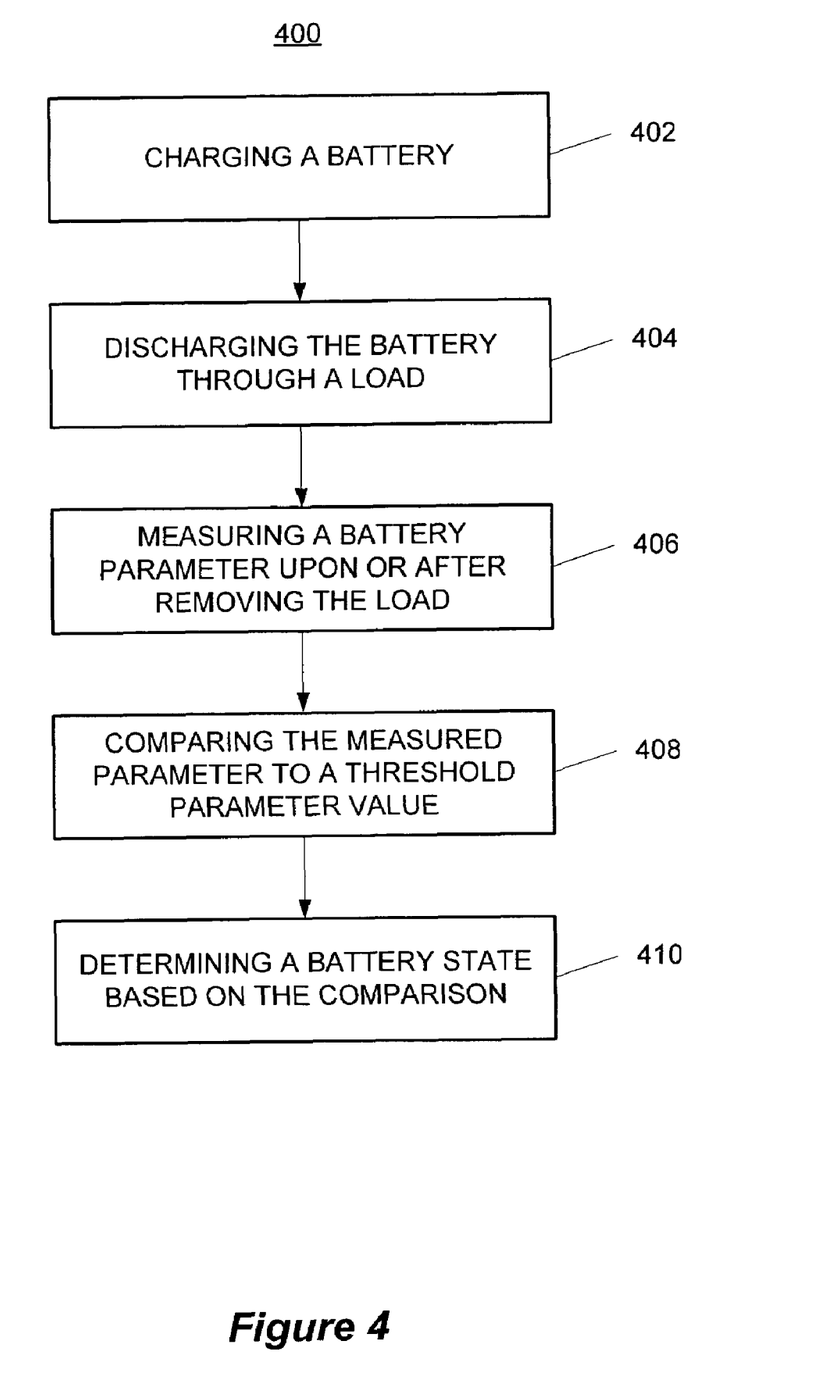
FIG. 4 illustrates one embodiment of a method according to the invention for determining the SOH of a battery based on a voltage measurement.

FIG. 4 illustrates one embodiment of a method 200 according to the invention for determining the SOH of a battery based on a voltage measurement. Method 400 begins with step 402 which consists of charging the battery. In one embodiment, the battery is charged until it has achieved, or nearly achieved, its maximum rated charge capacity. In another embodiment, charging may be accomplished by means of a DSP controlled battery charger executing an appropriate charging program. When a desired charge capacity is reached, step 404 is performed in which the battery is discharged through a load. In another embodiment, the battery may be discharged at a substantial rate for a fixed period of time. A "substantial rate" may be any rate equal to 2 to 10 times the rated capacity of the battery under test. The duration of discharge may be any time period that satisfies a substantial rate for a particular value of discharge current. Rated capacity is based on manufacturer ratings, for example, 500 mA/hr. In one embodiment, discharge variables such as rate and duration may also be controlled using a DSP and an appropriate discharging program. When the desired duration has elapsed, the load is removed to stop the discharge. Next, in step 406, a battery parameter such as voltage is measured upon or after removing the load. In one embodiment, this measurement is made immediately after removing the load. As used herein, the term "immediately" means within about 100 milliseconds. In one embodiment, the timing of an "immediate" measurement may be coordinated by means of a DSP controlled battery charger. In step 408, the measured parameter is compared to a threshold parameter that is maintained in memory. The threshold parameter may be retrieved, for example, from memory housed within the battery pack, or from memory resident in the battery charger. In the final step 410, the battery state or SOH is determined, for example, as a pass or fail based on the comparison of the parameter measured in step 406 to the threshold parameter. In one embodiment, if the measured parameter matches or exceeds the threshold, the SOH is a pass, otherwise, the SOH is a fail. Where a failure is indicated, a method 400 is very effective in determining whether defective conditions exist within the battery. For example, certain values of measured voltage are indicative of open cell, shorted cell, and weak cell conditions.

Figure 5:
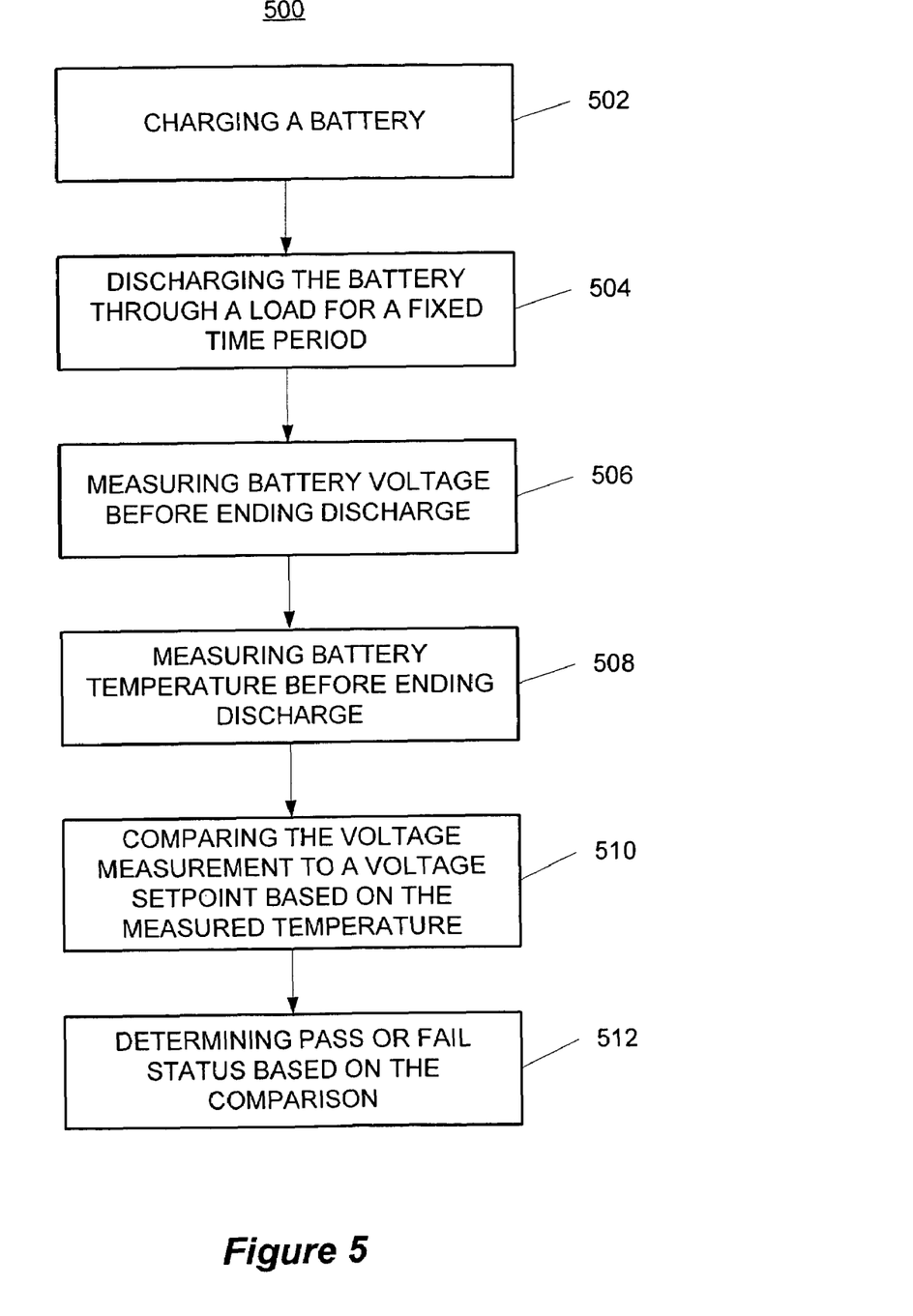
FIG. 5 illustrates another embodiment of a method according to the invention for determining the SOH of a battery based voltage and temperature measurements.

FIG. 5 illustrates a method 500 according to the invention for determining the SOH of a battery based voltage and temperature measurements. The process begins at step 502 by charging a battery by a DSP controlled process, or by any other appropriate means known in the art. In step 504, the battery is discharged as in method 200, and in step 506, a voltage measurement is taken at the end of the cycle when the battery has been substantially discharged. In step 508 a measurement of the temperature of the battery is taken at about the same time as the voltage measurement taken in the previous step. The next step in the process is step 510, in which the measured voltage is compared to a voltage setpoint that accounts for temperature. The setpoint value for a discharged battery voltage, compensated by the measured value of battery temperature, is based on empirical or manufacturer data. The setpoint may be obtained, for example, from a lookup table located in memory, or from a computation based on a mathematical algorithm or a computer program executed by a DSP. Finally, in step 512, the battery SOH is determined based on the comparison performed in the previous step. As in the previous method, the SOH may be expressed as a pass where the measured voltage meets or exceeds the setpoint, otherwise the SOH may be expressed as a fail.

Figure 6:
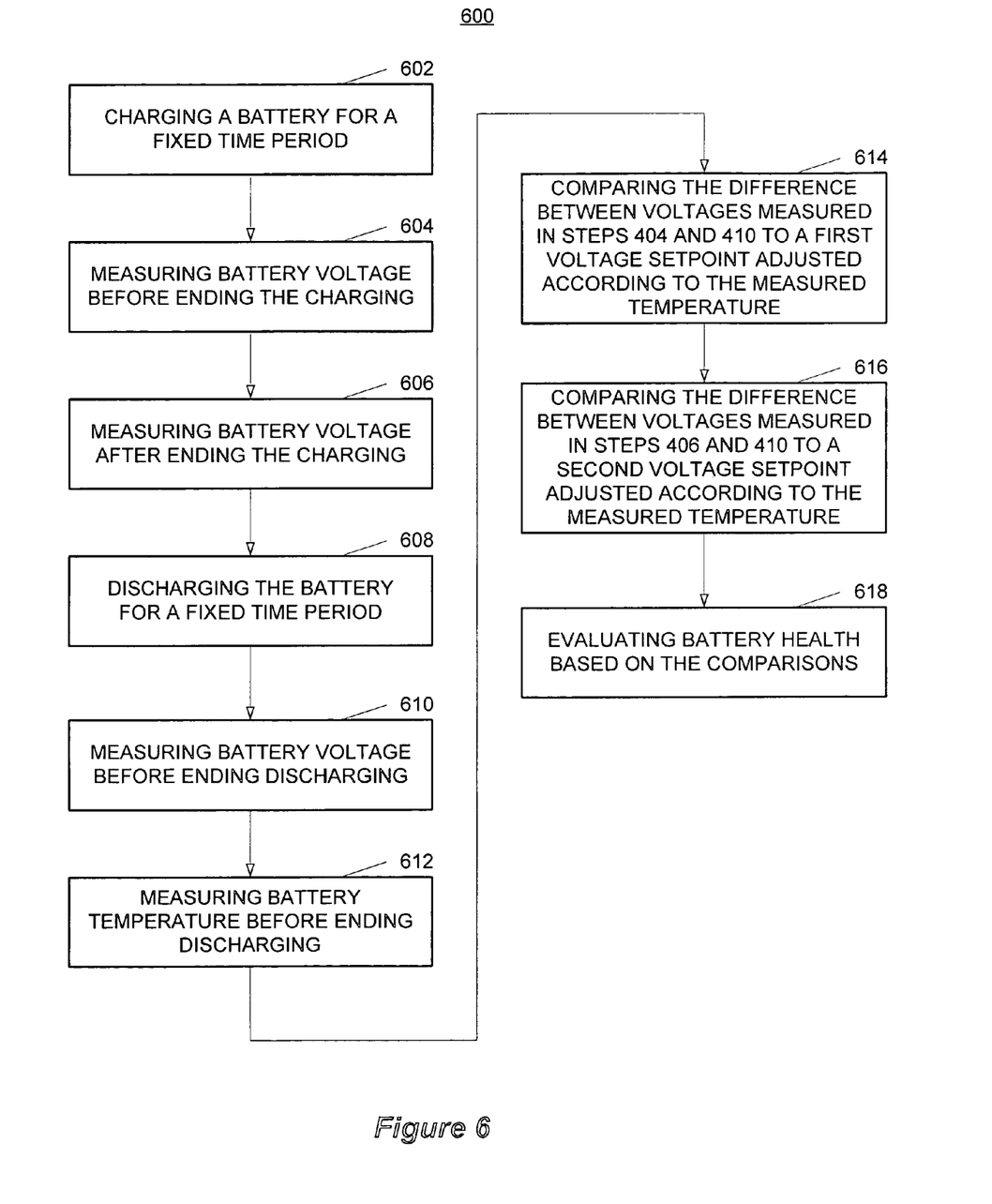
FIG. 6 illustrates another embodiment of a method according to the invention for determining the SOH of a battery based on voltage measurements adjusted for temperature.

FIG. 6 illustrates another method according to the invention for determining the SOH of a battery. Method 600 begins at step 602, where the battery under test is charged for a fixed period of time by any of the means previously discussed. Then, two voltage measurements are taken in quick succession. In step 604, the battery voltage is measured upon, before, or immediately before the end of the charging cycle. In step 606, the battery voltage is measured upon, before, or immediately after the end of the charging cycle. After these measurements are taken, in step 608 the battery is discharged through a load at a substantial rate for a period of time. As in previous embodiments, the duration of discharge may be predetermined and closely controlled by means of the DSP. Next, step 610 is performed by taking another measurement of battery voltage upon, before, or immediately before the end of the discharge cycle. In step 612, at about the same time as the previous voltage measurement, battery temperature is measured. After the discharge cycle is completed, the measured voltages are compared to a voltage setpoint. In step 614, the difference between measurements of step 604 and step 610 is compared to a first setpoint value, where the first setpoint value is determined based on the temperature measured in step 612. As above, the first setpoint may be retrieved from memory or calculated. Similarly, in step 616, the difference between measurements of step 606 and step 610 is compared to a second setpoint, where the second setpoint value is also determined according to the temperature from step 612. In step 618, the SOH is evaluated based on the comparisons in the two previous steps. Using this method, a SOH may be expressed as a fail if one of the comparisons fails to pass, or if both comparisons fail to pass.

Figure 7:
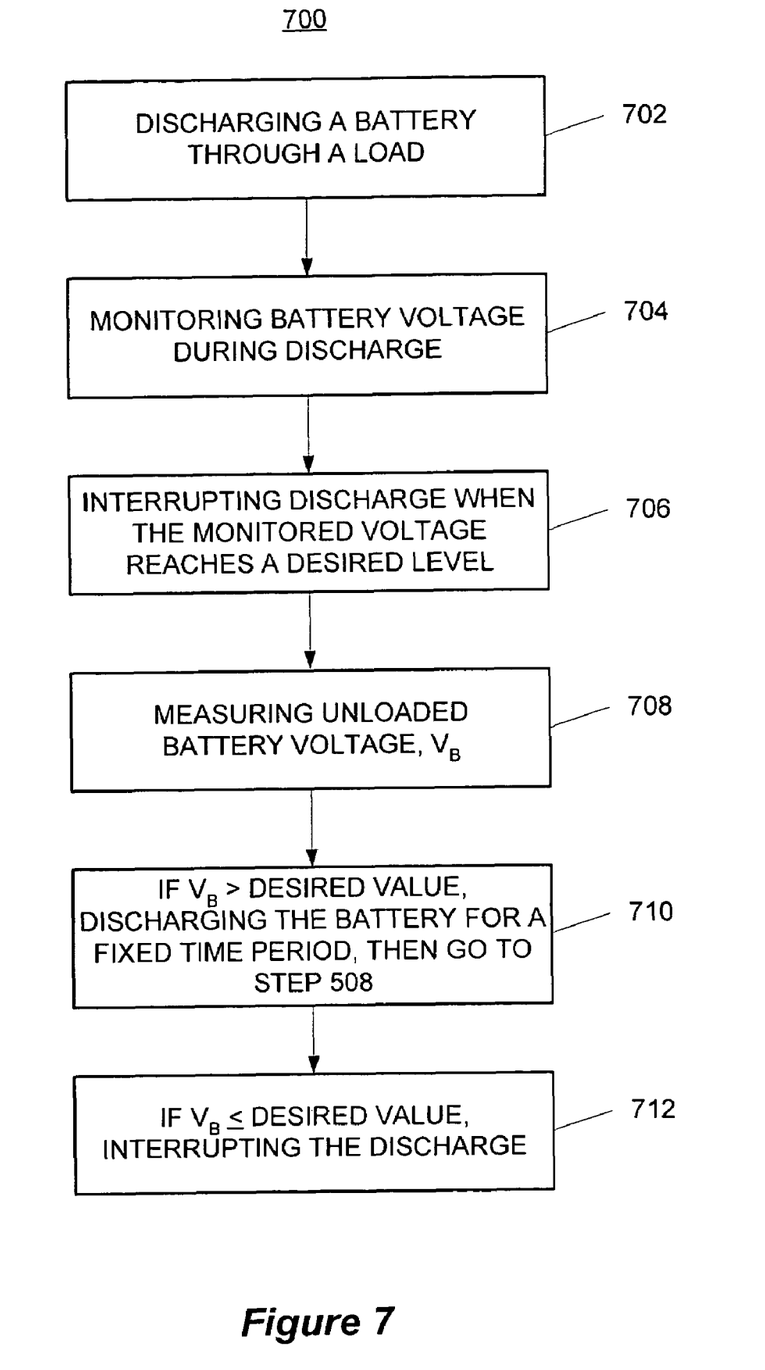
FIG. 7 illustrates a method according to the invention for discharging a battery to achieve a desired voltage.

FIG. 7 illustrates a method 700 according to the invention for discharging a battery to achieve a desired voltage. This method may be employed in any of the methods of the present invention that include a discharge step, in order to control the duration of discharge. The method begins at step 702 by discharging the battery through a load. In step 704, battery voltage is monitored during discharge. The next step 706 comprises interrupting the discharge by removing the load when the monitored voltage reaches a desired level. When the load is removed from the battery, battery voltage may drift to another value. Thus, in step 708, the battery voltage is measured again, this time with the load removed. In step 710, the measured value of unloaded battery voltage is compared to the desired level. If the unloaded voltage exceeds the desired level, then the battery is discharged for a fixed time period, and the method loops back to step 708. The fixed time period will vary according to the type of battery under test. In one embodiment, the fixed time period is stored in battery pack memory. If, however, the unloaded voltage is less than or equal to the desired level, then step 712 is performed, in which the discharge is interrupted by removing the load.

Figure 8:
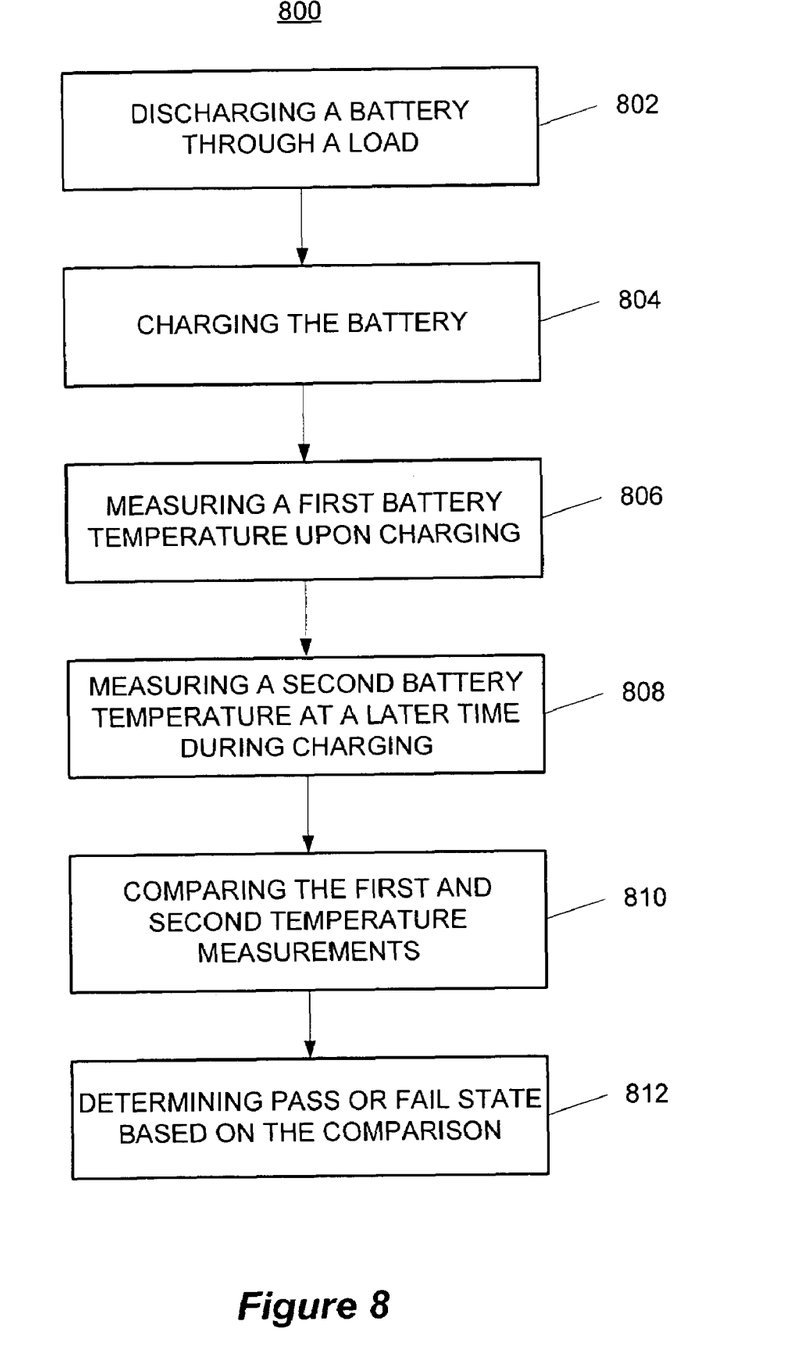
FIG. 8 illustrates embodiment of a method according to the invention for determining the SOH of a battery based on temperature measurements.

FIG. 8 illustrates a method 800 according to the invention for determining the SOH of a battery based on temperature measurements. The first two steps comprise a reconditioning step. In step 802, a battery is discharged through a load, and in step 804, the battery is charged. These steps may be performed as previously discussed. The next step in the process is step 806. Step 606 comprises making a first measurement of battery temperature at or immediately after the commencement of battery charging. Next, in step 808, a second temperature measurement is taken at some later time during the charging process. In step 810, the temperature measurements from the two previous steps are compared, and in the final step 812, the SOH is determined based on this comparison. The criteria for determining SOH will vary according to the type of battery under test, and may be stored in battery pack memory. For example, if a battery starts its charging cycle at a temperature above 35 C, and the temperature has not dropped by at least one degree after ten minutes has elapsed, the SOH may be considered a fail. As another example, a NiCad battery that begins charging at a temperature of 40 degrees C. should show at least a 1 degree C. drop in temperature after ten minutes. If at that time the temperature is higher than 39 degrees C., the SOH will fail. If however, after ten minutes the temperature is 39 degrees C. or lower, the SOH is pass, unless some other evaluation fails it.

Figure 9:
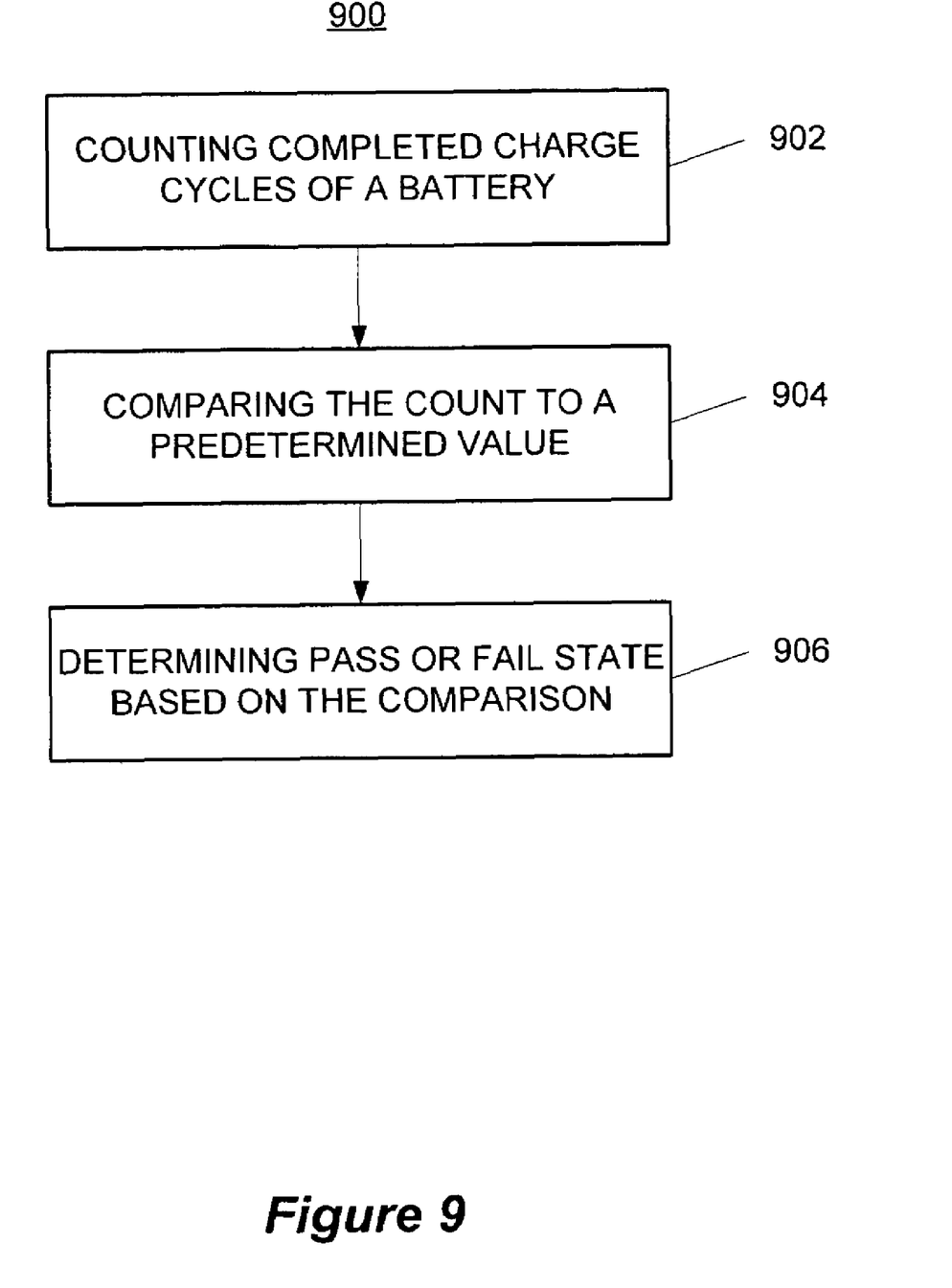
FIG. 9 illustrates an embodiment of a method 700 according to the invention for determining the SOH of a battery based on an elapsed number of charging cycles.

FIG. 9 illustrates a method 900 according to the invention for determining the SOH of a battery based on an elapsed number of charging cycles. The first step 902 is a counting step wherein a total count is maintained for the completed number of charging cycles that a battery has undergone in its lifetime. The total count may be maintained in battery pack memory, and incremented upon the completion of each additional charging cycle, for example, by a write signal initiated by the battery charger DSP. In the next step 904, the total count is compared to a predetermined, empirical value indicative of an expected number of charging cycles that a battery can withstand during its useful service life. For example, a NiCad battery may be given as many as three hundred charging cycles before its reliability becomes unacceptable. The specific charge cycle value is dependent on battery type, and may be stored in battery pack memory. In the final step 906, the SOH is determined by simple comparison of the total count to the predetermined number of expected charging cycles. If the count is equal to or less than the predetermined number, the SOH is a pass, otherwise, the SOH is a fail.

Figure 10:
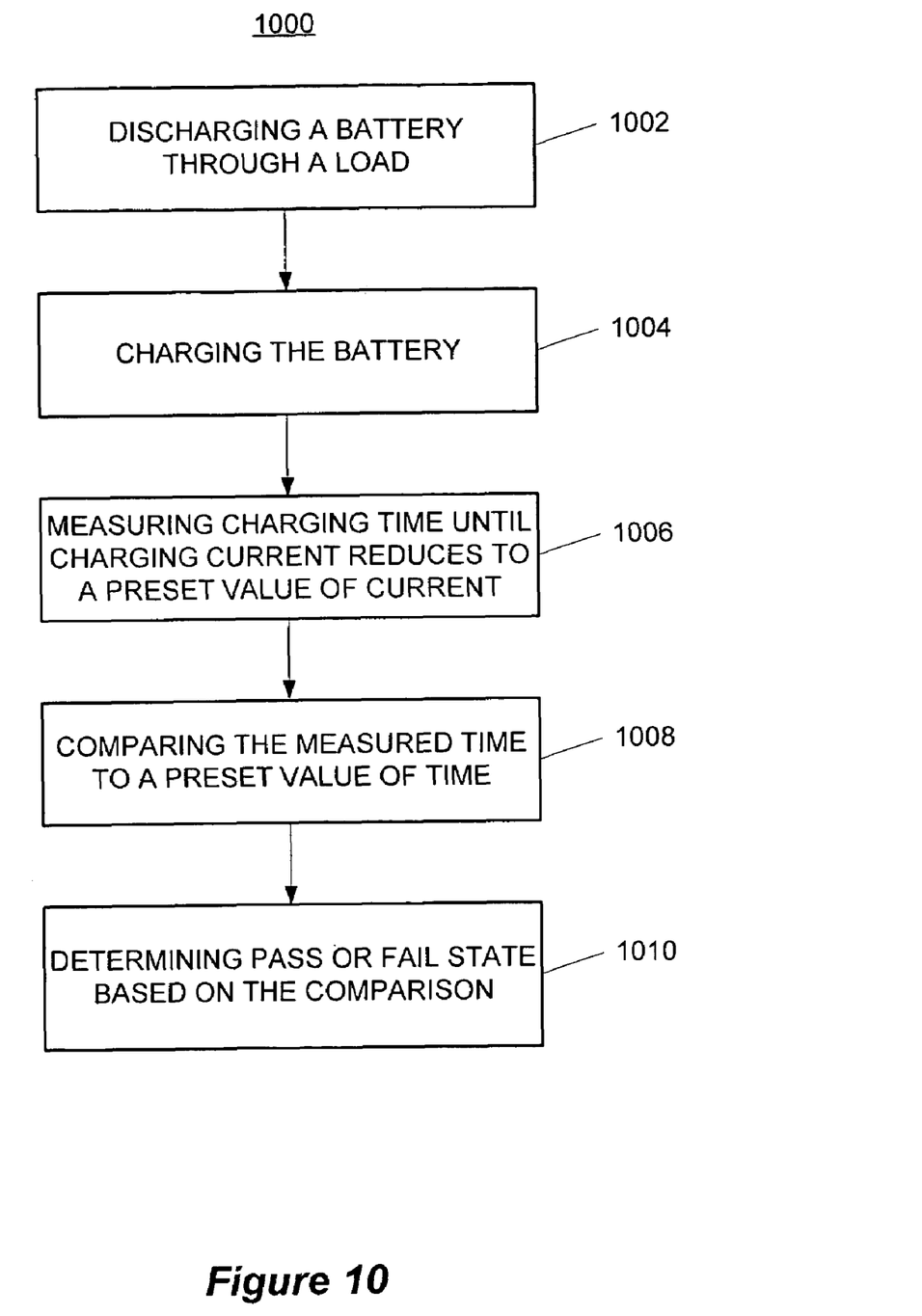
FIG. 10 illustrates an embodiment of a method according to the invention for determining the SOH of a battery based on the total time required to charge the battery.

FIG. 10 illustrates a method 1000 according to the invention for determining a SOH of a battery based on the total time required to charge the battery. The first two steps, 1002 and 1004, are reconditioning steps similar to the first two steps of method 800 in which a battery is first fully discharged, and then fully recharged. In the third step 1006, a measurement is taken of the total time required for the battery to become fully recharged. The clock starts at commencement of charging, and stops when the charging current reaches a predetermined value. The value may be based, for example, on the time required to bring a battery up to 95% of total charge capacity. In one embodiment, this value may be stored in battery pack memory. When the charging current reaches the predetermined value, the battery is approximately fully charged. Next, in step 1008, the measured time is compared to a preset value representing the expected charging time for a battery in a good state of health. This preset value may also be stored in battery pack memory. In the final step 1010, the SOH is determined based on the comparison. If the measured time exceeds the preset value, the SOH is a fail, otherwise, the SOH is a pass.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for determining a battery state, comprising:
   charging the battery;
   discharging the battery through a load at a substantial rate for a period of time, a substantial rate being at least two times a rated capacity of the battery;
   measuring a battery voltage before ending the discharge;
   measuring a battery temperature before ending the discharge;
   comparing the voltage measurement to a voltage setpoint adjusted according to the measured temperature; and
   determining the battery state based on the comparison.

2. The method of claim 1 wherein the battery comprises multiple batteries electrically coupled to form a battery pack.

3. The method of claim 1 wherein the battery further comprises a solid state memory device.

4. The method of claim 3 wherein the memory device stores data representative of the period of time.

5. The method of claim 3 wherein the memory device stores data representative of the setpoint.

6. A method for determining a battery state, comprising:
   charging the battery;
   discharging the battery through a load at a substantial rate for a period of time;
   measuring a battery voltage before ending the discharge;
   measuring a battery temperature before ending the discharge;
   comparing the voltage measurement to a voltage setpoint adjusted according to the measured temperature;
   determining the battery state based on the comparison;
   monitoring battery voltage during discharge;
   interrupting the discharge by removing the load when the monitored voltage reaches a desired voltage level;
   measuring unloaded battery voltage; and
   (a) if the unloaded voltage is greater than the desired voltage, discharging the battery for a period of time by reconnecting the load, and then continuing the method at the previous step (measuring unloaded battery voltage);
   (b) if the unloaded voltage is equal to or less than the desired voltage, interrupting the discharge.

7. A method for evaluating a state of a battery having a solid state memory device, the method comprising:
  charging the battery for a period of time;
  (a) measuring a battery voltage before ending the charging;
  (b) measuring a battery voltage upon or after the charging;
  discharging the battery through a load at a substantial rate for a period of time;
  (c) measuring a battery voltage before ending the discharging;
  measuring a battery temperature before ending the discharging;
  comparing the difference between the voltages measured in steps (a) and (c) to a first setpoint adjusted according to the measured temperature;
  comparing the difference between the voltages measured in steps (b) and (c) to a second setpoint adjusted according to the measured temperature; and
  evaluating the state of the battery based on the comparisons to the first and second setpoints.

8. The method of claim 7 wherein the evaluating step further comprises determining a "pass" or "fail" health status.

9. The method of claim 7 wherein the memory device stores data representative of battery type.

10. The method of claim 7 wherein the memory device stores the first and second setpoints.

* * * * *